United States Patent [19]

Hautvast et al.

[11] Patent Number: 5,057,971
[45] Date of Patent: Oct. 15, 1991

[54] MODULAR STOCKABLE HOUSING FOR ELECTRONIC DEVICE

[75] Inventors: Heinz-Josef Hautvast, Brigachtal; Heinz Kelch, Königsfeld; Siegfried Koch, Villingen-Schwenningen, all of Fed. Rep. of Germany

[73] Assignee: Mannesmann Kienzle GmbH, Villingen, Fed. Rep. of Germany

[21] Appl. No.: 388,993

[22] Filed: Aug. 3, 1989

[30] Foreign Application Priority Data

Mar. 8, 1988 [DE] Fed. Rep. of Germany ....... 3826382

[51] Int. Cl.$^5$ .............................................. H05K 7/20
[52] U.S. Cl. ..................... 361/395; 361/386; 361/394; 361/396; 174/59; 174/65 R; 220/4.6
[58] Field of Search .......................... 174/59, 60, 65 R; 211/41; 206/509; 220/4 C; 165/80.3, 185; 200/307; 361/383, 384, 386, 388, 393–397, 399, 412, 413, 415, 417, 419, 420, 427–429

[56] References Cited

U.S. PATENT DOCUMENTS

| | | |
|---|---|---|
| 1,678,852 | 7/1928 | Ehrenfeld ............................ 174/60 |
| 3,052,748 | 9/1962 | Curtiss ............................. 174/65 R |
| 3,904,937 | 9/1975 | Levin .................................. 361/394 |
| 3,997,819 | 12/1976 | Eggert .............................. 361/394 |
| 4,339,628 | 7/1982 | Marcantonio ..................... 361/396 |
| 4,680,674 | 7/1987 | Moore ............................... 361/396 |
| 4,692,840 | 9/1987 | Ellis .................................. 361/393 |
| 4,866,572 | 9/1989 | Blodgett ............................ 361/396 |

Primary Examiner—Gerald P. Tolin
Attorney, Agent, or Firm—Toren, McGeady & Associates

[57] ABSTRACT

A expandable housing for an electronic device allows additional modules to be received in a simple manner so as to build on a base module and which is suitable for use in a vehicle. The housing comprises a frame, in which provisions are made for receiving a printed circuit board, a base assigned to the frame and a cover, which base and cover are identically constructed, as well as a hood which is fastenable at the frame and serves to hold cables. The frame, cover and base are connected with one another by means of groove-and-tongue connections and are held together, in addition, by through-screws.

8 Claims, 5 Drawing Sheets

MODULAR STOCKABLE HOUSING FOR ELECTRONIC DEVICE

The invention is directed to a housing for an electronic device, which housing is constructed so as to be closable as a spatial cell or module and which can be mounted on or at a wall in such a way that it is protected against soiling or dirt and tampering and also so that it can be expanded in a stepwise manner.

BACKGROUND OF THE INVENTION

As a rule, the computing and processing capacity of so-called single-board computers is entirely sufficient for most information and regulating tasks, as well as for the data acquisition and data processing processes required, in which, for example, a plurality of measured quantities or limiting values are linked to form a single statement or are compared or computed with housekeeping data.

When there is a multitude of such tasks to be performed in, for example, utility vehicles, it is advisable, for reasons relating to exchangeability and maintainability as well as to the desires and needs of a user and the adaptability of the respective data processing system to the specific application, that a computer module be provided in addition to a base module for every task and for every area of tasks or determined task groups in order to achieve the greatest possible efficiency in vehicle operation. For a utility vehicle, such as a taxi or other delivery vehicle, such task areas are, for example, the determination of working time and the prompt information of the driver or drivers of the vehicle according to certain guidelines, the determination of data for an optimization of the use of the vehicle, the processing and display of current operating data, for example, also acoustic signaling during unreliable operating states of the vehicle, the determination and preparation of determined operating data for vehicle maintenance which is prompt and flexible and adapted to the requirements, determination of routes and orders in the distribution of goods and/or receipt of goods, or the determination of the degree of utilization of and loading of public means of transportation, and wide ranging monitoring and control functions in special vehicles, for example, in refrigerator vehicles, vehicles for spreading salt or sand, and the like.

In contrast to a stationary application, there are considerable problems related to the installation of such computer modules in a vehicle already because of the different architectures of the vehicle and because of the severe environment in which the computer modules are used. In addition, high demands are placed on user and service friendliness, as a rule, and favorable accessibility and exchangeability are accordingly expected. If only a few of the multitude of conceivable computer modules are selected, a flat arrangement of the modules one next to the other or even a scattered arrangement are excluded because of tight space restrictions. Moreover, adaptability to the specific application and the user's possibility of selection require that the respective data processing system can be installed not only by automobile manufacturers, but also that it can be installed subsequently in any service workshop or tailored for the first time on location, so to speak, specifically with the lowest possible requirement for structural component parts and a minimum of expenditure on wiring and assembly in order to keep the costs of such a system as low as possible.

The high degree of modularity which is required for the provided adaptability requires storage and availability of the structural component parts of the system in large numbers, i.e., the structural component parts must be capable of being produced in large numbers and must accordingly be designed as simply as possible so that they can be produced in a favorably reproducible manner with as few and as simple tools as possible.

SUMMARY OF THE INVENTION

The principal object of the present invention accordingly consists in finding a housing architecture with which a housing for an electronic device, in other words, for a central arrangement of one or more computer modules, can be formed, which housing satisfies the conditions of large-scale production, can be produced and assembled at low cost in particular, is also suitable for use in a vehicle, and can be expanded in a simple manner.

The solution to this problem in accordance with one aspect of the invention is a first frame member having complementary joint-forming means at opposite ends cooperating with similarly configured base and cover members each provided with joint-forming means capable of engaging and interfitting with the frame member joint-forming means. By assembling the base and cover members to opposite sides of the frame member, a substantially closed single section module can be formed capable of housing an electronic device. Electrical connections to the electronic device are provided by an electrical connector on the device mating with a complementary connector via a side wall of the frame. Multiple sections are readily formed by attaching a second frame member having matible joint-forming means and assembling the cover to the outside of the second frame member. Suitable fastening means are provided to hold together the assembly of base, frame or frames and cover members.

A preferred embodiment of the invention is characterized by at least one frame having at one end a circumferentially extending tongue or web, and at the opposite end a circumferentially extending groove. The frame is provided with internal means for receiving a printed circuit board, and at least one opening which is provided at a side wall of the frame and through which a plug or socket connector is accessible. The base and cover, which preferably are identical, each contain complementary tongues and grooves for fitting to the frame. Screws can be employed which pass through the base and cover to hold the assembly together.

The housing concept, according to the invention, provides a frame which is particularly simple to produce in terms of manufacturing technology, as well as a base and a cover which are identically constructed. With a suitable construction of the groove-and-tongue connections, a self-contained spatial cell or module can already be formed. This frame, in which the printed circuit board of the respective computer module can be inserted prior to the completion of the housing—the printed circuit board thus remains accessible and capable of being tested at both sides prior to the assembly of the housing—can be placed on a support as a component part and stacked to form a multiple-layered, multiple-sectioned housing safeguarded against dirt or tampering, with or without a cover member as a stabilizing intermediate plate. In stacking, only longer screws are required in order to hold together a module block formed from a plurality of frames.

In addition, it is particularly advantageous that only an opening with rough tolerances be provided in one frame wall, through which opening the plug-in connections can be effected with plug-connector socket or sockets arranged on the printed circuit board. This opening is preferably closed by means of an installation hood which is provided with fastening means for incoming and outgoing cables. The installation hood is constructed in such a way that it can be aligned to the frame and fastened thereto in an advantageous manner by means of setting a screw of the housing.

Accordingly, only three tools are required for the production of the actual housing carrying the computer module or computer modules and for the structural component parts of expanded versions.

The fastening of the housing, for example, at a chassis wall, can be effected in the simplest case in that the screws which assemble the housing are screwed to the chassis wall. In this case, only four screws are required in order to hold together the housing and the module block, respectively, and to fasten them at a chassis wall. However, it is more advantageous that mounting means, such as a bracket or stirrups, with which the housing screws can be connected and which can be screwed in turn at a chassis wall, be attached to the housing. Twisting of the housing in the event of an uneven underlying support can accordingly be prevented and an opening of the housing or adding on sections, respectively, can be effected when the base is mounted on the chassis wall if a suitable force-locking or self-locking connection is provided between the stirrups and the housing base. This fastening of the housing allows a somewhat pleasing external form, i.e., fastening eyelets formed on or at the bases or covers, which would otherwise be required, can be dispensed with.

For the sake of completeness, it is noted that expansion can be provided, for example, also with printed circuit boards which only fill half the frame, and that the printed circuit boards are preferably provided with plug-in connections in order to install an internal bus between a plurality of printed circuit boards.

It is significant that the preliminary costs for the expandable base module of a data processing system are relatively small with the solution according to the invention.

DESCRIPTION OF DRAWINGS

The invention is now explained in more detail in connection with several exemplary embodiments with the aid of the attached drawings, wherein.

DETAILED DESCRIPTION OF PREFERRED EMBODIMENTS

Figure 1:
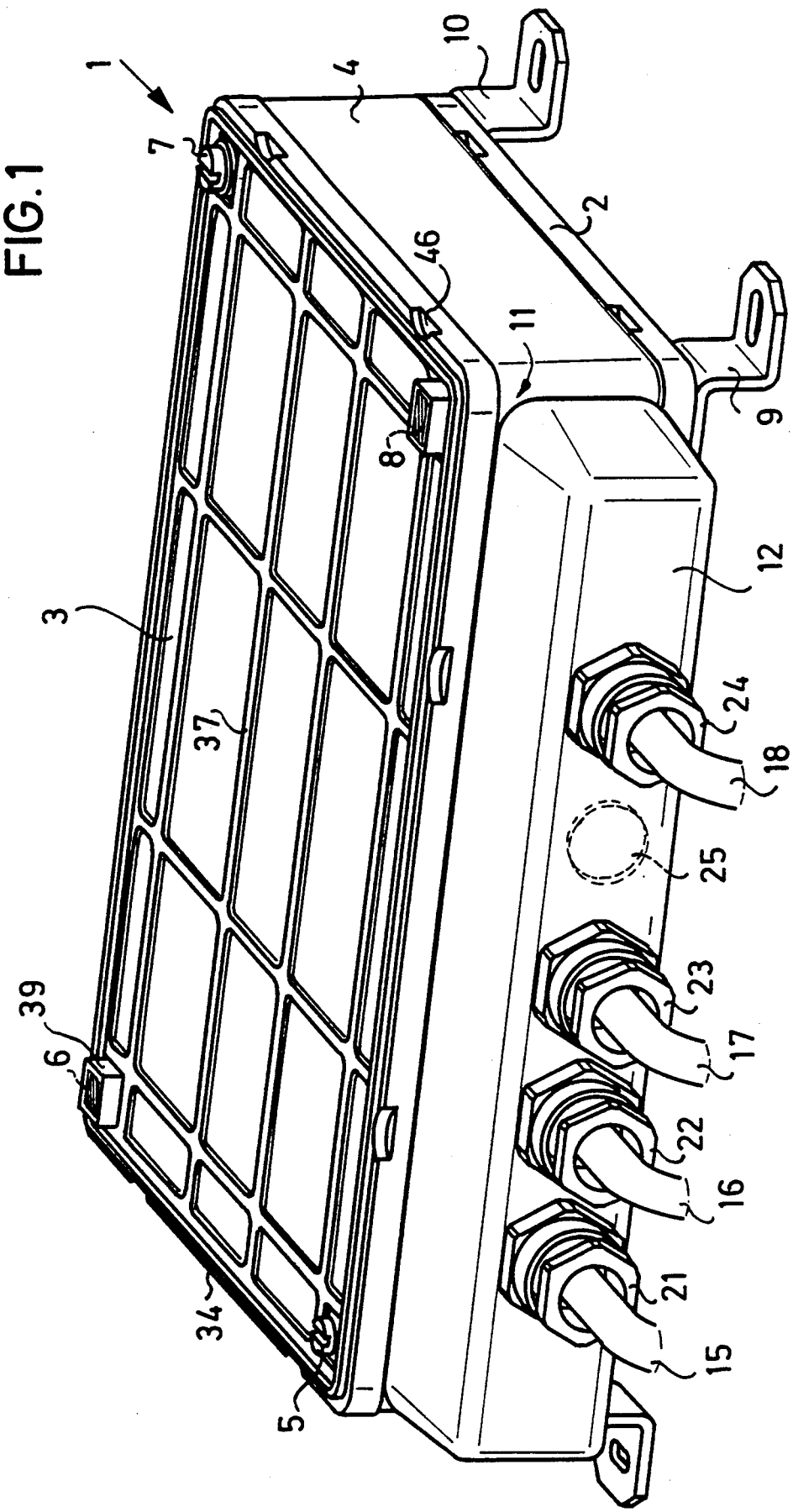
FIG. 1 is a perspective overview of one form of housing according to the invention.

As shown in FIG. 1, the housing 1 substantially comprises a base 2, a cover 3 and a frame 4 which are connected and screwed together with stirrups or brackets 9 and 10, which serve for the fastening or mounting of the housing 1 at a chassis wall by means of screws 5, 6, 7 and 8, two of which—6 and 8—are sealed, for example, with lead, to avoid tampering. A hood 12 which is associated with a side wall 11 of the frame 4 serves to cover at least one opening 13 (FIG. 2) in the wall 11, through which plug-in connectors, for example, 14, which form the end of feed-in electrical or light-conducting cables, for example, 15, 16, 17 and 18, are insertable into the interior of the frame and connectable with plug-connector sockets fastened on a printed circuit board 19. One of the plug-connector sockets is designated by 20 in FIG. 2. Stress-free fastening of the cables 15, 16, 17 and 18 at the hood 12 is effected by means of conventional crimping connectors 21. Cable feeds which are not in use but which are available, as desired, remain closed by means of a break-out section or film 25 formed during the production of the hood 12, which section 25 can be broken out when needed. The cables provide the connections to sensors, to other devices, which, for example, already supply condensed data, to apparatus which is to be controlled or regulated, to manual entry devices, to displays or printing units, to portable storages and the like.

In addition, the hood 12 is constructed in such a way that it is held at the wall 11 of the frame 4 by means of a locking connection preferably comprising an arm as shown requiring an inserting and displacing movement. A projecting hook 26, which is formed at the hood 12 and comprises a cut out portion 27, serves to secure the locking connection and fastening of the hood 12 at the wall 11 of the housing 1. In the aligned state of the hood 12, the cut out portion 27 is located in the insertion path of and is engaged by the screw 8. The hood 12 is provided with a circumferentially extending seal 28 and is secured simultaneously with the setting and sealing of the screw 8.

Figure 2:
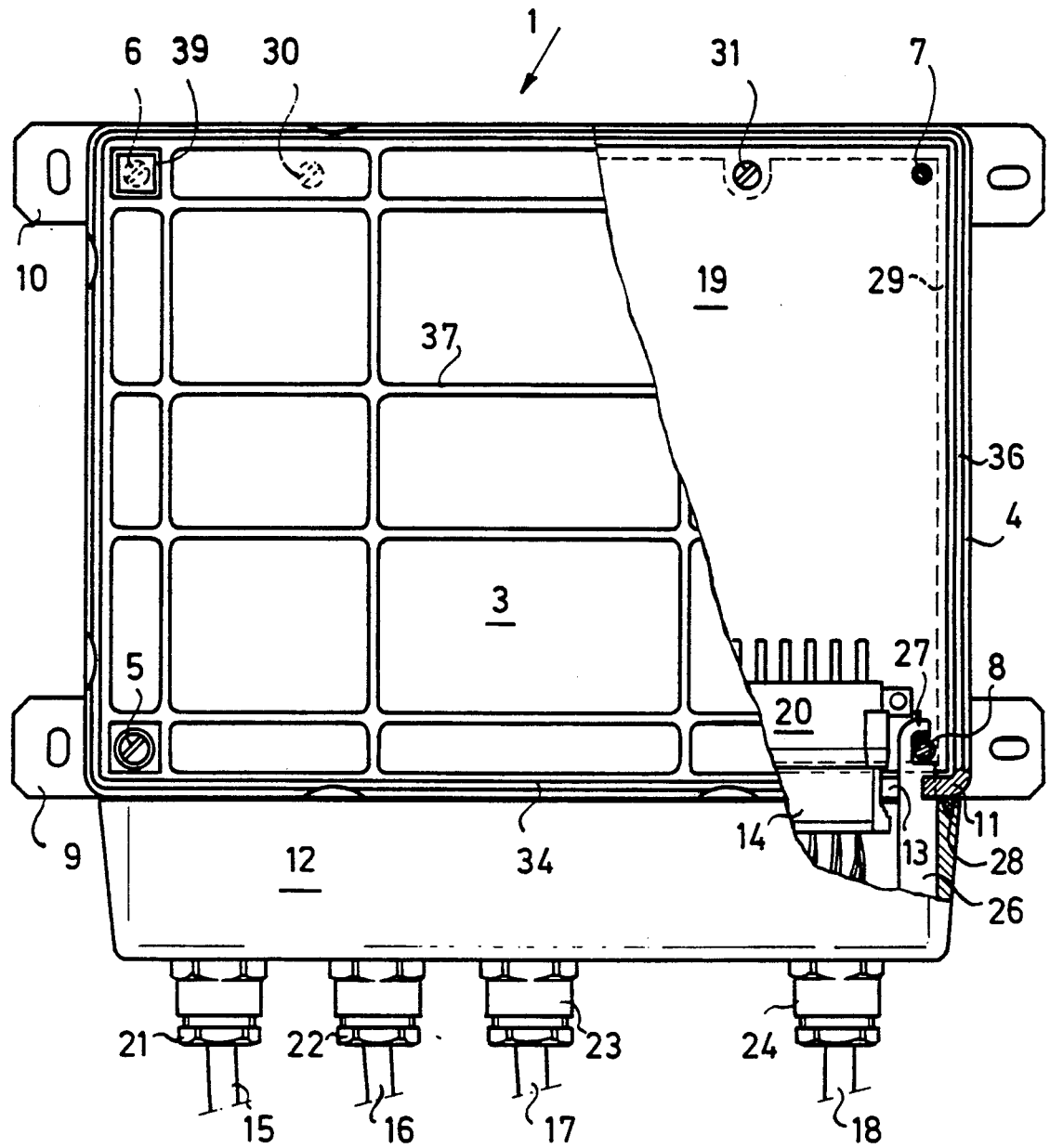
FIG. 2 is a top view of the housing of FIG. 1 with a partial section of the cover and hood.
Figure 4:
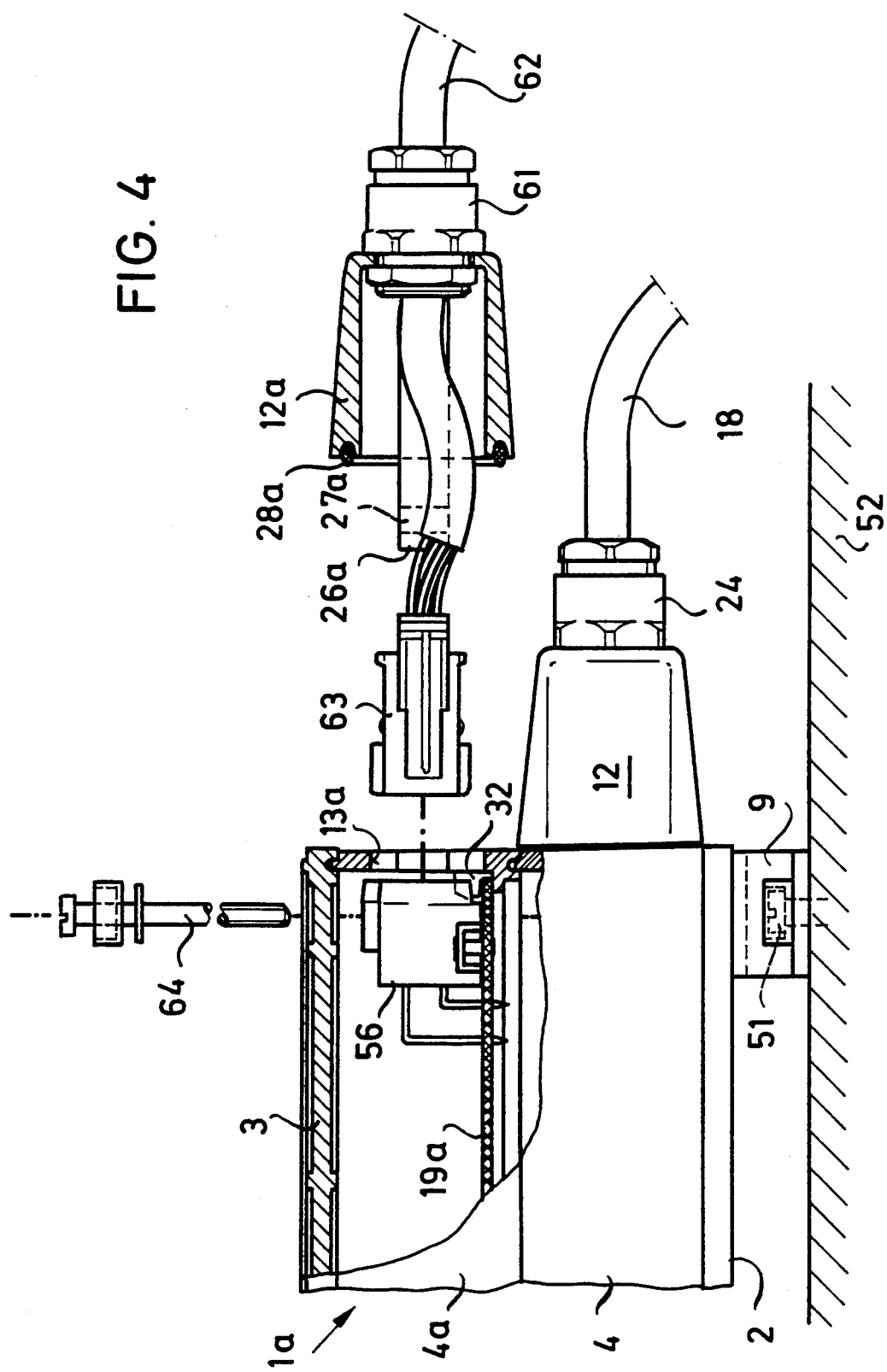
FIG. 4 is a side view of the housing according to FIG. 3, shown in part, with a hood in the assembled position.

As can be seen in addition from FIG. 2, a circumferentially extending strip 29, which can also be divided up, for example, into individual brackets, is constructed inside the frame 4 and serves as a support for the printed circuit board 19. The printed circuit board 19, which, in addition to the plug-in connectors for the different inputs and outputs, carries the components of the computer, is held in place by two screws 30 and 31 with suitable projections of the strip 29, not described in more detail, and by a slot connection which is constructed at the opposite side of the frame 4 and is realized, for example, by means of two projections or lugs 32 which extend from the strip 29 and are arranged at a certain distance one next to the other (FIG. 4).

In order to provide a spatial cell which is safeguarded against the penetration of dirt and tampering, circumferentially extending grooves 33 and 35 and complementary circumferentially extending webs or tongues 34 and 36, respectively, which are configured to engage to one another, are provided at the base 2, the cover 3 and the frame 4, so that a self-contained groove-and-tongue or groove-and-web connection occurs already when the three structural component parts are assembled; the connection can be filled in, in addition, if necessary, by means of suitable sealing material. As can be seen particularly in the section according to FIG. 3, the base 2 and cover 3 are shaped so as to be completely identical. Both the base 2 and the cover 3 are stiffened by means of ribs 37 on both sides and to increase surface area to increase heat dissipation. Moreover, the through-bore holes, not designated in more detail, for the screws 5, 6, 7 and 8 are provided with countersinks 38 for arranging lead cups 39, as well as with countersinks 40 located on the opposite sides for the insertion of and countersunk arrangement of nuts for the screws 5, 6, 7 and 8, which insertion is a safeguard against twisting. The use of nuts is required when a fastening of the housing 1, according to FIG. 5, is to be effected so as to be flush with the base and wall.

Figure 5:
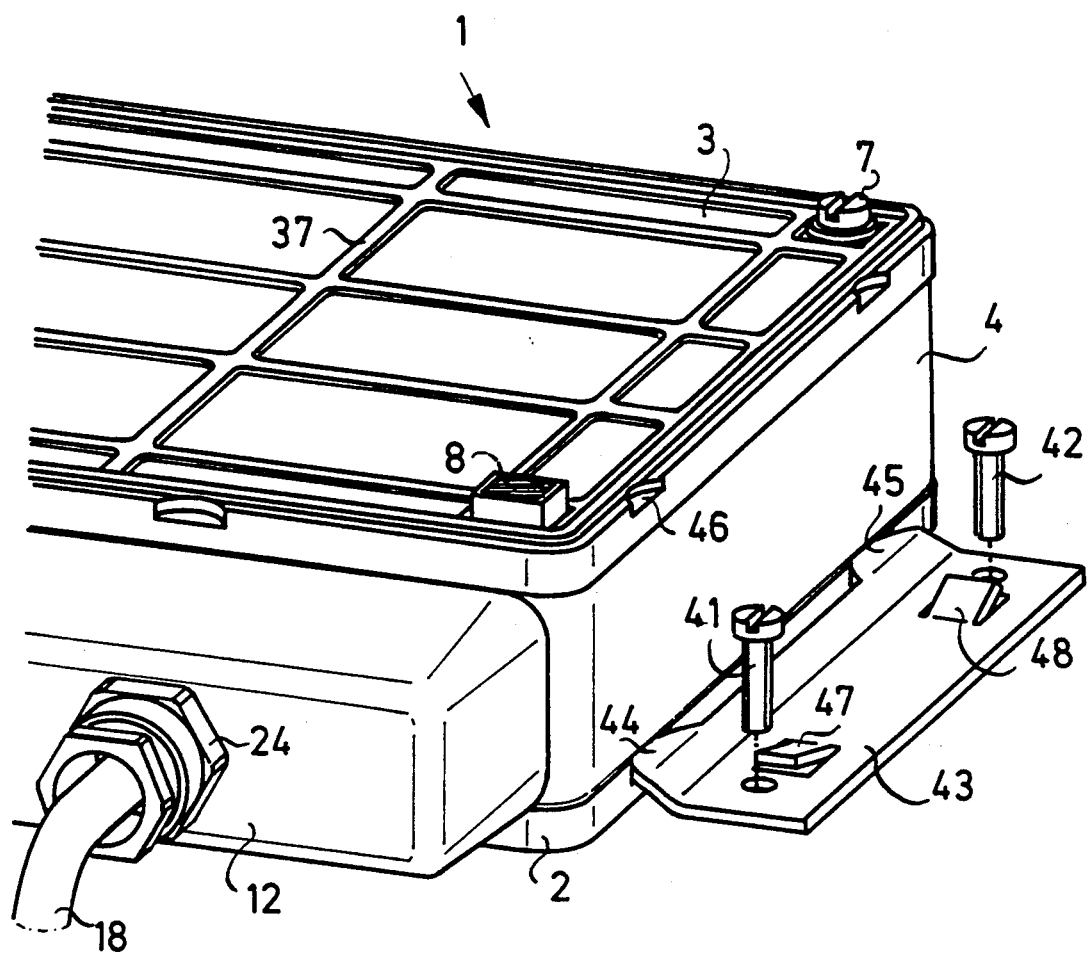
FIG. 5 is a partial perspective view of the housing, according to FIG. 1, with fastening means allowing a fastening flush with the base and wall.

In the manner of fastening according to FIG. 5, at least two retaining rails 43 are used which are fastenable by means of screws 41 and 42, claws or lips 44 and 45 being formed at the retaining rails 43. These claws 44 and 45 engage in suitable cut out portions or recesses constructed in the base 2 and cover 3 on the basis of the identical construction—one of which cut out portions is designated by 46. Tabs 47 and 48, which are bent out of the retaining rails 43, serve to safeguard the lead securing means, for example, a lead cup, not shown here, against twisting.

Figure 3:
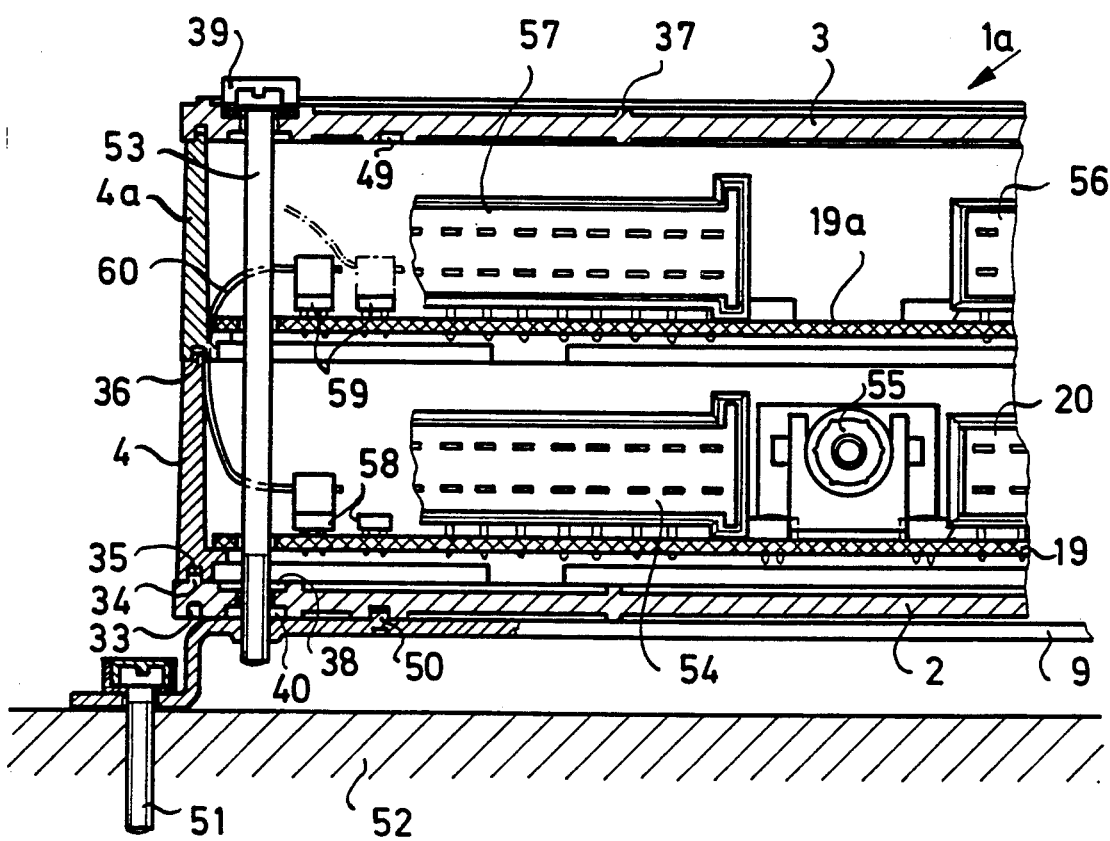
FIG. 3 is a cross-section of part of the housing of FIG. 1 expanded by a second expansion stage.

In addition, as can be seen from FIG. 3, countersinks 49 are constructed at the base 2 and cover 3 which serve for positive-locking and force-locking connection with the stirrups 9 and 10 and with pins 50 which are formed thereon. The stirrups 9 and 10 and accordingly the housing 1 or, as shown by FIG. 3, a housing 1a which is expanded by means of a second frame 4a, are screwed, for example, to a chassis or mounting wall 52, by means of sealed screws 51. In addition, FIG. 3 shows that only longer screws 53 and 64, respectively, in FIG. 4, are required for the expansion of the housing 1, which screws 53 and 64 engage through the two frames 4 and 4a and the printed circuit boards 19 and 19a and engage threaded holes in stirrups 9 and 10. Additional plug-connector sockets assigned to the printed circuit board 19a are designated by 54 and 55. Plug-connector sockets which are fastened on the printed circuit board 19a and make contact with the latter are designated by 56 and 57. In addition, the printed circuit boards 19 and 19a carry plug-connector sockets 58 and 59 in pairs; a bus or cable 60, which is looped through a suitable cut out portion in the respective strip 29, can be coupled from one printed circuit board to the other via the plug-connector sockets 58 and 59.

It can be seen from FIG. 4 that a hood 12a can be associated with the second expanded frame 4a. A cable 62, which engages through the crimping connection 61, terminates in a plug-in connector 63 which is connectable with a plug-connector socket 56. This connection is shown just before being carried out, in the position shown in FIG. 4. The cable 62 is then pulled through in order to shorten the cable piece between the plug-in connector 63 and the hood 12a. The hood 12a is aligned to the frame 4a and secured by means of setting the screw 64 in the manner shown at 26, 27 and 8 in FIG. 2, and finally the cable 62 is clamped in the hood 12a by means of the crimping connection 61.

It is mentioned, in addition, that printed circuit boards 19 of different sizes can be fastened in the frame 4, so that it can be sufficient to provide only catch connections between the frame and the respective printed circuit board. Accordingly, it is conceivable to install two add-on board computers in addition to a base computer with only one housing expansion using two frames. It is noted, in addition, that at least the insides of the housing can be metallized or provided with a conductive varnish for grounding interference voltages, and that the printed circuit boards can be grounded via the strips 29.

As will be evident from the foregoing, employing one frame with base and cover provides a one-section sealed housing. Removing the cover and adding a second frame and attaching the cover on top of the second frame provides a two-section housing. More frames can be added to stepwise increase the size of the housing. The complementary shapes of the joint-forming connections, with each frame provided at opposite ends with one of the shapes, and with similar base and cover, each provided similarly with both complementary shapes, allows easy assembly and housing expansion, while providing an interior that can be rendered immune to contamination.

While the invention has been described in connection with preferred embodiments, it will be understood that modifications thereof within the principles outlined above will be evident to those skilled in the art and thus the invention is not limited to the preferred embodiments but is intended to encompass such modifications.

We claim:

1. An expandable housing for an electronic device comprising at least one empty, rectangular, open-ended frame having flat side walls and at one end a rectangular first connection means and at the other end a rectangular second connection means which is complementary to and configured to interfit with the first connection means, a base member and a substantially similarly configured cover member, said base member having at one side rectangular third connecting means engaging and interfitting with one of said first and second connection means to for a first substantially sealed rectangular joint, said cover member having at one side rectangular fourth connection means engaging and interfitting with the other of said first and second connection means to form a second substantially sealed rectangular joint whereby a closed housing is formed, means on the inside of the frame receiving and supporting a printed circuit board, a flat side wall of said frame having an opening, an electrical connector inside the housing and accessible for receiving a complementary connector engaging said side wall opening, and fastening means passing entirely through the frame member, cover and base members and fastening together said cover member, frame and base members.

2. Housing according to claim 1, further comprising at least a second frame identical to the said one frame and engaging with its connection means complementary connection means on said one frame, said cover being attached to said second frame.

3. An expandable housing for an electronic device, said housing being constructed so as to be closable in such a way that it is safeguarded against dirt and tampering and so as to be expandable in stages, comprising at least one empty, rectangular, open-ended frame having flat side walls and at one end a projecting rectangular tongue and at another end a recessed rectangular groove, means inside of the frame receiving a printed circuit board, a flat side wall of the frame having at least one opening, a base having a rectangular tongue on one side and a complementary rectangular groove on the other side and interfitting with a complementary frame end, a cover substantially identical to the base and having a complementary rectangular tongue and groove on opposite sides and interfitting with the opposite frame end, and screws which pass entirely through the frame, base and cover and engage through the cover holding them in opposed assembled relation with the frame ends.

4. Housing according to claim 3, characterized in that stirrups are provided which are mounted to the base and serve for the fattening of the housing at a wall, said stirrups having threaded holes for engagement with said screws.

5. Housing according to claim 4, characterized in that force-locking means are provided to secure the stirrups at the base.

6. Housing according to claim 3, characterized in that at least two retaining rails are provided for fastening the housing at a wall so as to be flush with the base and wall, said base having cut-out portions, said rails having claws in engagement with the cut-out portions.

7. Housing according to claim 3, characterized in that a hood equipped with cable feed and fastening means is connected with the side wall of the frame so as to cover its opening.

8. Housing according to claim 3, further comprising a hood member sealingly engaging a side wall of the frame, said hood member having projections extending into the housing interior and engaged by said screws and holding said hood against said frame.

* * * * *

UNITED STATES PATENT AND TRADEMARK OFFICE
CERTIFICATE OF CORRECTION

PATENT NO. : 5,057,971
DATED : October 15, 1991
INVENTOR(S) : Heinz-Josef Hauvast It is certified that error appears in the above-identified patent and that said Letters Patent is hereby corrected as shown below:

ON THE TITLE PAGE

Item [30], Foreign Application Priority Data
       August 3, 1988 [DE] Fed. Rep. of Germany ...3826382

Signed and Sealed this

Twenty-ninth Day of June, 1993

Attest:

MICHAEL K. KIRK

*Attesting Officer*    *Acting Commissioner of Patents and Trademarks*